United States Patent [19]

Ferrier et al.

[11] Patent Number: 5,536,386
[45] Date of Patent: Jul. 16, 1996

[54] PROCESS FOR PREPARING A NON-CONDUCTIVE SUBSTRATE FOR ELECTROPLATING

[75] Inventors: Donald Ferrier, Thomaston; Rosa Martinez; Eric Yakobson, both of Waterbury, all of Conn.

[73] Assignee: MacDermid, Incorporated, Waterbury, Conn.

[21] Appl. No.: 386,755

[22] Filed: Feb. 10, 1995

[51] Int. Cl.$^6$ .......................... C25D 5/02; C10M 125/02; C10M 125/04; C10M 173/00
[52] U.S. Cl. .......................... 205/125; 205/159; 205/162; 205/163; 205/164; 205/165; 205/166; 205/167; 205/183; 205/205
[58] Field of Search .................................. 205/118, 122, 205/125, 159, 162, 163, 164, 165, 166, 167, 205, 183; 252/11, 22, 29

[56] References Cited

U.S. PATENT DOCUMENTS

| | | | |
|---|---|---|---|
| 2,872,391 | 2/1959 | Hauser et al. | 205/164 |
| 4,041,347 | 8/1977 | Deal et al. | 252/506 |
| 4,379,762 | 4/1983 | Chiyoda et al. | 252/506 |
| 4,434,064 | 2/1984 | Chao et al. | 252/29 |
| 4,888,134 | 12/1989 | Kleitz et al. | 252/506 |
| 4,964,959 | 10/1990 | Nelsen et al. | 205/159 |
| 5,234,627 | 8/1993 | Damschroder | 252/510 |
| 5,389,270 | 2/1995 | Thorn et al. | 252/22 |

*Primary Examiner*—John Niebling
*Assistant Examiner*—Edna Wong
*Attorney, Agent, or Firm*—John L. Cordani

[57] ABSTRACT

The modification of carbon particles is disclosed for achieving enhanced plating upon a non-conductive surface which has been previously treated with said modified carbon particles. The invention is particularly useful in plating through holes of printed circuit boards.

18 Claims, No Drawings

PROCESS FOR PREPARING A NON-CONDUCTIVE SUBSTRATE FOR ELECTROPLATING

BACKGROUND OF THE INVENTION

The present invention relates to a process for enhancing the electroplating of non-conductive surfaces, such as the through holes of a printed circuit board (PCB). The inventive process includes depositing on the non-conductive surface a layer of carbon (e.g. graphite, carbon black or some other intermediate carbon structure) which carbon has been specially modified. It has been found that the practice of this invention eliminates the need for electroless plating of the non-conductive surface, while reducing the covering time, and enhancing the coverage and ease of plating as compared to the use of unmodified carbon as the initiating layer.

Printed circuit boards are generally composed of a non-conductive layer, such as an epoxy resin/glass fiber mixture, which is positioned between copper or nickel plates or foils, or other conductive metal layers. There can also be a multiplicity of these alternating layers. Commonly, holes are drilled through the PCB to establish a connection between the conductive metal layers at specific points in the board. The holes are then metallized to form a connection between the conductive materials, usually by plating.

In order to achieve conductivity and consistent and reliable bond between the electroplated metal (usually copper), and the through holes, the through holes are usually first provided with a layer of electroless copper in a process which requires several steps, including pre-activation, activation with a palladium/tin activator, application of an accelerator, electroless copper deposition and one or more rinses, before electroplating could be effected.

The need for application of electroless copper can be avoided, it has been found, by the deposition of carbon black on the through holes or other non-conductive surface which is to be electroplated. In this way, the long process time, complex chemistry requiring constant monitoring, and sensitivity of electroless baths to contamination can be avoided. Moreover, the expensive waste treatment often required with electroless copper and palladium/tin activators can be eliminated.

However, the use of a carbon black deposition process has several drawbacks. After carbon black deposition, it takes several minutes before the non-conductive surface being plated is completely covered by the electroplated metal. This is especially significant where the surface to be plated is a through hole. Electroplating after treatment with carbon black begins adjacent to the outer conductive surfaces (i.e., the copper foil) of the PCB and extends inward towards the center of the hole. This occurs from both sides of the through hole and the plating meets in the center and completes the connection. In addition, it is sometimes difficult to achieve complete coverage and acceptable plating particularly in small, high aspect ratio holes. Finally, possibly, because of the resistance of the carbon black layers, it can be difficult or impossible to plate large areas of non-conductive surfaces, as are required in general plating on plastics.

This "bridging" of the hole is a slow process and provides unwanted opportunities for defects in the metal plate, such as voids. In addition, because of the time it takes for "bridging" to occur after carbon black deposition, carrying out the process in a conveyorized manner can be commercially impractical, and hampers the ability to add a conveyorized electrolytic copper flash immediately after carbon black treatment.

Prior to the development of electroless methods of plating through holes, it was suggested to use graphite to prepare the walls of the through holes prior to plating. Radovsky et al. in U.S. Pat. No. 3,099,608, teaches a process for preparing the through hole walls of a printed circuit board by initially depositing a thin electrically non-conductive film of palladium metal in at least a semi-colloidal form in the through holes. It is indicated by Radovsky et al. that graphite had been used previously as a conductive base layer for electroplating (see col. 1, lines 63–70, and col. 4, line 72—col. 5, line 11). It is noted by Radovsky et al. that there are several defects with the prior art graphite process including lack of control of the graphite application, poor deposit of the resultant electroplated metal, non-uniform through hole diameters, and low electrical resistance of the graphite. It is also mentioned by Shortt et al. U.S. Pat. No. 3,163,588 that graphite (or equivalents of graphite) may be employed to render through hole walls of electric circuit boards conductive for later electroplating metals thereon.

Graphite has also been employed in numerous other types of processes for preparing a non-conducting material for a metal coating or plating. For instance, U.S. Pat. No. 409,096 to Alois Blank teaches a process for applying copper to asbestos roofing material. The process involves applying a powdered plumbago (graphite) in a volatile liquid such as varnish to the surface of the asbestos, then evaporating the volatile liquid to coat the asbestos fibers with particles of plumbago. The graphite coated asbestos sheets are then immersed in a copper solution and electric current is applied to form a thin film of copper on the sheets. The copper coated sheet is then immersed in a bath of molten metal such as tin, lead, or zinc, and is removed from the molten bath to effect solidification. The resulting metal coated asbestos sheet is described as being relatively flexible, a non-conductor of heat and substantially fireproof.

In U.S. Pat. No. 1,037,469 to Goldberg and U.S. Pat. No. 1,352,33 1 to Unno, processes for electroplating non-conducting materials are described, which involve coating the material with wax and then a slurry of particles of graphite or other metal, followed by electroplating of the coated surface with copper or other metal. Neither of these processes are particularly suitable for use in coating the hole walls of circuit boards because the holes are normally extremely narrow in diameter and immersing in wax would tend to plug the hole and prevent coating the through hole walls with an electroplating material.

A process which involves "graphiting" a thin layer onto the non-conducting surface followed by applying a copper layer electrolytically and "finally a further electrolytic deposit of another metal" is disclosed by Laux in U.S. Pat. No. 2,243,429.

The first practical teaching of a carbon black deposition system, which permits the elimination of electroless copper deposition prior to electroplating, was by Minten and Pismennaya in U.S. Pat. No. 4,724,005, the disclosure of which is incorporated herein by reference in its entirety. Although the carbon black process they disclose is effective, the long "bridging" time (ie. the time necessary to fully connect both sides of the hole with the plated metal or to achieve substantial coverage) created is not recognized, nor any solution proposed. A long line of patents have issued concerning improvements to or variations in the process described in U.S. Pat. No. 4,724,005 including U.S. Pat. No. 5,139,642 to Randolph et al., the teachings of which are incorporated herein by reference in their entirety, but none of them address or relate to the invention at hand.

What is desired is a carbon treatment process which is effective for promoting the electroplating of a non-conductive surface, while reducing the "bridging" time observed when electroplating.

SUMMARY OF THE INVENTION

It is an object of the invention to present a process for electroplating non-conductive surfaces. It is another object of the invention to present a process for metallizing the through holes of a printed circuit board. It is still another object of the invention to present a process for electroplating a non-conductive surface while enhancing the speed of the electroplating operation and the ultimate coverage achieved. Finally, it is an object of the present invention to present an improved process for electroplating non-conductive surfaces by the elimination of the need for deposition of electroless copper by use of a dispersion of specially modified carbon (the use of the word, "carbon" in this application shall be taken to mean carbon black, graphite or any intermediate structures of carbon), while enhancing the speed and coverage of the electroplating process.

These objects, as well as others which will become apparent to the skilled worker, are obtained by the practice of this process for enhancing the electroplating of a non-conductive surface disclosed herein, which includes the steps of treating the non-conductive surface to be plated with a liquid dispersion which comprises carbon particles, which carbon particles have been specially modified to promote plating, and a liquid dispersing medium; removing at least about ninety (90%) percent of the liquid dispersing medium to deposit the carbon particles on the non-conductive surface in a substantially continuous manner; and electroplating a substantially continuous conductive metal layer over the deposited carbon and the non-conductive surface.

The modifications made to the carbon surface can take several forms, however all the modifications proposed herein either reduce the resistivity of the carbon layer, increase the activity of the carbon surface toward plating, or improve the uniformity of the carbon layer and/or the dispersion creating the carbon layer. Several examples of modified carbons consist of carbon black or graphite pre-treated with particular dyes, carbon black or graphite pre-treated with conductive metals, carbon black or graphite which has been chemically oxidized, or mixtures or combinations thereof.

DETAILED DESCRIPTION OF THE INVENTION

As noted above, a preferred embodiment of the present invention relates to the preparation of a PCB through hole for the deposition of an electroplated layer of copper or other conductive metal (such as nickel, gold, silver, etc.) so as to form a connection between conductive metal layers which are sandwiched with non-conductive layers. Although this description will be written in terms of electroplating (or metallizing) the through holes of printed circuit boards, it will be understood that such is for ease of description only, and that the disclosed process is equally applicable to the preparation of various non-conductive surfaces for deposition of an electroplating metal layer on plastics applications.

Printed circuit boards are generally comprised of two or more plates or foils of nickel or copper, which are separated from each other by a layer of non-conducting material. The non-conducting layers are typically comprised of an organic material such as an epoxy resin which has been reinforced with glass fiber.

Alternatively, the non-conducting layer may also be comprised of thermosetting resins, thermoplastic resins, and mixtures thereof, with or without reinforcing materials such as fiberglass and fillers.

Suitable thermoplastic resins include the acetyl resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon, polyethylene; polypropylene, polystyrene, styrene blends, such as acrylonitrile styrene co-polymers; polycarbonates; polychlorotrifluorethylene; and vinyl polymers and co-polymers, such as vinyl acetate, vinyl alcohol, vinyl butyral, vinyl chloride, vinyl chloride-acetate co-polymer, vinylidene chloride and vinyl formal.

Suitable thermosetting resins include alkyl phthalate; furane; melamine-formaldehyde; phenol formaldehyde and phenol-furfural co-polymer, alone or compounded with butadiene acrylonitrile co-polymers; polyacrylic esters; silicones; urea formaldehydes; epoxy resins, polyimides, alkyl resins, glycerol phthalates; polyesters; and the like.

Through holes are formed in printed circuit boards in order to establish connection between the metal plates at certain points in the board to produce the desired electrical pattern. This is usually accomplished by drilling holes at the desired locations through the copper plates and the non-conducting layers, and then connecting the separate metal plates by metallizing the through holes (i.e., coating the inner surface of the through hole with a conductive metal). The hole diameters of PCBs generally range from about 0.15 millimeters to about 10.0 millimeters, more typically from about 0.3 millimeters to about 1.0 millimeters.

In order to make the walls of the through holes relatively smooth, if desired, it may be necessary to deburr the holes. In the case of multilayer printed circuit boards, it may also be desirable to subject the boards to a desmear or etchback operation to clean the inner copper interfacing surfaces of the through holes. The present invention includes any such suitable preparative operations.

Advantageously, the printed circuit board is then pre-cleaned in order to place it in condition for receiving the liquid carbon black dispersion of this invention. In one preferred pre-cleaning operation, the PCB is placed in a cleaner/conditioner bath for several minutes at a temperature of about 130° F. to remove grease and other impurities from the hole wall surfaces. One preferred Cleaner/Conditioner, 110C, is sold by MacDermid Incorporated of Waterbury, Conn. After the application of the cleaner/conditioner, the printed circuit board is rinsed to remove any residual cleaner/conditioner from the board. It should be recognized that none of the above-mentioned hole drilling or pre-cleaning operations is a critical feature of the present invention. Any and all conventional equivalents to these operations may be used instead.

Typically, the carbon deposition process involves the application of a liquid carbon dispersion to the cleaned printed circuit board. This dispersion contains three principal ingredients, namely carbon, one or more surfactants capable of dispersing the carbon, and a liquid dispersing medium such as water. The preferred methods of applying the dispersion to the PCB include immersion, spraying or other methods of applying chemicals used in the printed circuit board industry. A single working bath is sufficient for applying this carbon black dispersion; however, more than one bath may be used for rework or other purposes.

In preparing the liquid carbon dispersion, the three primary ingredients, and any other preferred ingredients, are mixed together to form a stable dispersion. This may be accomplished by subjecting a concentrated form of the dispersion to ball milling, colloidal milling, high-shear milling, ultrasonic techniques or other like procedures to thoroughly mix the ingredients. The dispersion can then be later diluted with more water to the desired concentration for the working bath. The preferred method of mixing is ball milling a concentrated form of the dispersion in a container having glass mineral or plastic beads therein for at least about 1 hour. The mixing can continue for up to about 24 hours. This thorough mixing allows for the carbon particles to be intimately coated or wetted with the surfactant. The mixed concentrate is then mixed with water or some other liquid dispersing medium to the desired concentration. The working bath is preferably kept agitated during both the diluting and applying steps to aid in maintaining dispersion stability.

The particle diameter of the carbon particles should average no more than about 3 microns while in the dispersion. It is desirable to have this average particle diameter of carbon as small as possible to obtain desired plating characteristics, such as substantially even plating and no plating pullaways. The average particle diameter of the carbon particles is preferably from about 0.05 microns to about 3.0 microns, more preferably between about 0.08 microns and about 1.0 microns when in the dispersion. The term "average particle diameter" as used herein refers to the average mean diameter of the particles (the average by number). The average mean diameter in the dispersion may be determined through the use of either a NiComp Model 370 submicron particle sizer (Version 3.0) or a HIAC PA-720 automatic particle size analyzer (both available from the HIAC/ROYCO Instrument Division of Pacific Scientific of Menlo Park, Calif.). It is also important to maintain the size distribution of the carbon particles to a relatively narrow distribution.

Many types of carbon may be used for this invention including the commonly available carbon blacks, furnace blacks, and suitable small particle graphites. However, it is preferred to utilize carbon blacks which are initially acidic or neutral, i.e. those which have a pH of between about 1 and about 7.5 and more preferably between about 2 and about 4 when slurried with water. The carbon black particles which are preferred are also very porous and generally have as their surface area from about 45 to about 1100, and preferably about 300 to about 600, square meters per gram, as measured by the BET method (method of Brunauer-Emmert-Teller).

Among the commercially available carbon 6lacks suitable for use in this invention are Cabot XC- 2R Conductive, Cabot Monarch 800, Cabot. Monarch 1300, all available from Cabot Corporation of Boston, Mass. Other suitable carbon blacks include Columbian T-10189, Columbian Conductiex 975 Conductive, Columbian CC-40,220, and Columbian Raven 3500, all available from Columbian Carbon Company of New York, N.Y. Cabot Monarch 1300 and Columbian Raven 3500 are the two most preferred carbon blacks because of their ease of dispersion and low pH. Suitable graphites include Showa-Denko UFG available from Showa-Denko K.K., 13-9 Shiba Daimon 1-Chome, Minato-Ku, Tokyo, 105 Japan, Nippon Graphite AUP available from Nippon Graphite Industries, Ishiyama, Japan, and Asbury Micro 850, available from Asbury Graphite Mills of Asbury, N.J.

Regardless of the type of carbon used, the carbons used in the dispersions of this invention are modified such that the electroplating of the substantially continuous carbon layer on the non-conductive surface is enhanced or improved. The improvements in electroplating may be manifested in several ways such as increased propagation rate of the plating front, improved coverage of the non-conductive surface with the plated metal, decreased plating time necessary to achieve complete coverage of the non-conductive surface and decreased resistance of the carbon coated non-conductive surface, all in comparison to the non-modified carbon. Thus significant advantages are achievable by modifying the carbon, particularly through surface modification of the carbon, used in the invention of this application. These modifications are particularly suitable to use with carbon black, but can also be used effectively with other forms of carbon such as graphite or intermediate structures of carbon.

The modifications proposed by this invention can take several forms, however all the modifications proposed herein either reduce the resistivity of the carbon layer, improve the uniformity of the carbon layer on the non-conductive surface and/or the uniformity of the dispersion creating the carbon layer, increase the activity of the carbon surface toward plating, or combinations thereof. Thus the modifications are most appropriately described in functional terms which will lead one skilled in the art to achieve the proposed modifications in several ways. As used herein, carbon "modifications" shall not mean modification by means of mere additions of surfactants, or "binders", such as are discussed in PCT Patent No. WO94/26958, (U.S. patent application Ser. No. 08/232,574, May 3, 1994), the teachings of which are incorporated herein by reference in their entirety.

Surprisingly, the inventors have found that increased conductivity of the carbon treated surface (through-hole) may not necessary for improved plating. Although some of the modification proposed herein reduce restivity of the treated surface, other modifications do not. However in all cases the platability of the modified carbon treated surface is improved compared to an unmodified treated surface in the identical process.

One way of achieving the proposed modification and the various advantages flowing therefrom is to treat the carbon with a dye prior to incorporating it in the dispersion composition. Various dyes can be used to modify the surface of the carbon, but it has been found that dyes having an aromatic nature particularly with an aromatic nitrogen are particularly useful in this regard.

Specific dyes useful in this invention are, without limitation, Methylene Blue, Methyl Red, Janus Green B and Xylene Cyanole. Although not wanting to be bound by theory, it is believed that any compound which is useful in enhancing electroplating, particularly in enhancing electroplating in low current density areas, will be useful in this regard. This includes typical electroplating bath additives, such as the dyes listed above. Treatment of the carbon with these dyes or other materials may consist simply of mixing the carbon particles with a solution containing the dye or other similar material for a period of time, separating the carbon from the aqueous solution, then incorporating the so treated or modified carbon into the carbon dispersion formulation as described previously in this application. The time and temperature of the modification or treatment of the carbon may vary as required (ie. time from 30 sec. to 2 hrs. or more and temperature from room temperature to boiling).

A second method of modifying the carbon according to this invention consists of treating the carbon with various metals such that the metals are either adsorbed onto the surface of the carbon or reduced onto the surface of the carbon. Various metals may be used for the purpose of this modification including without limitation palladium, platinum, silver, gold, nickel, cobalt and copper. The metals may be adsorbed onto the surface of the carbon in various ways such as simply mixing the carbon particles with an aqueous solution containing the metals in ionic or colloidal form, then separating the carbon particles from the aqueous solution and incorporating the so treated carbon particles into the dispersion formulation. As one example of this, the carbon particles may be treated by mixing them with a colloidal or ionic activator solutions containing palladium (such as those currently used to activate surfaces for electroless plating). Another method of modifying the carbon comprises reducing the various metals onto the surface of the carbon in a controlled manner. In using this modification method the carbon particles are first mixed into an aqueous solution containing metal ions. A reducing agent is then added to the solution in order to reduce the metal ions onto the carbon surface in a metallic form. Particular dyes discussed above may also be added to the solution for improved performance. As before, the time and temperature of the treatment may vary widely. Although the applicants do not wish to be bound by theory, it is believed that modifications of this type decrease the resistivity of the carbon layer upon the non-conductive surface and may also increase the uniformity and adherence of that carbon layer and/or the carbon dispersion which created it.

A third example of modifications which serve the purposes of this invention is oxidation of the surface of the carbon. This can be accomplished by any one or a combination of known means for achieving oxidation. One preferred method is chemical oxidation of the carbon, such as may be accomplished by mixing the carbon with a solution of nitric acid for a time and at a temperature effective to appropriately oxidize the surface of the carbon. While not wanting to be bound by theory, it is believed that this type of modification of the carbon surface uniformizes the carbon surface physically and/or modifies the chemical nature of the carbon surface such that the carbon forms a more uniform dispersion or a more uniform and/or adherent coating on the non-conductive surface. In the end as with the other modifications, the various advantages are manifested in improved coverage of the non-conductive surface with the plated metal, improved adhesion of the plated metal to the non-conductive surface, increased plating propogation rate, decreased resistance of the carbon coated non-conductive surface,increased activity of the carbon surface toward plating, or decreased plating time necessary to achieve complete coverage of the non-conductive surface with the plated metal.

Thus, the current invention relates to the discovery that the various types of carbon themselves, most notably carbon black, may be modified, most notably by surface modification of various types, such that the carbon dispersion formed with the modified carbon is more uniform or the carbon forms a more uniform, more adherent, more active, or less resistive coating on the non-conductive surface. These changes in the dispersion and/or the carbon coating, which resulted from the modification of the carbon itself, manifest themselves in improved coverage of the non-conductive surface with the plated metal, improved adhesion of the plated metal to the non-conductive surface, increased plating propagation rate, decreased resistance of the carbon coated non-conductive surface, or decreased plating time necessary to achieve complete coverage of the non-conductive surface with the plated metal. Three categories of modifications which will achieve all or some of these advantages are given above. Other types of modifications will be obvious to one skilled in the art who has read this disclosure and its examples.

In addition to water and carbon a surfactant capable of dispersing the carbon in the liquid dispersing medium is employed in the dispersion. One or more surfactants is added to the dispersion to enhance the wetting ability and stability of the carbon and to permit maximum penetration by the carbon within the pores and fibers of the non-conducting layer of the PCB.

Suitable surfactants include anionic, nonionic and cationic surfactants (or combinations thereof such as amphoteric surfactants). The surfactant should be soluble, stable and preferably non-foaming in the liquid carbon dispersion. In general, for a polar continuous phase as in water, the surfactant should preferably have a high HLB number (8–18).

The preferred type of surfactant will depend mainly on the pH of the dispersion. If the total dispersion is alkaline (i.e. has an overall pH in the basic range), it is preferred to employ an anionic or nonionic surfactant. Acceptable anionic surfactants include sodium or potassium salts of naphthalene sulfonic acid such as DARVAN No. 1, commercially available from Eastern Color and Chemical, PETRO AA and PETRO ULF, commercially available from Petro Chemical Co., Inc., and AEROSOL TO, commercially available from American Cyanamid. Preferred anionic surfactants include neutralized phosphate ester-type surfactants such as MAPHOS 55,56,8135, 60A and L6, commercially available from Mazer Chemical Co. The most preferable anionic surfactant for a liquid carbon black dispersion is MAPHOS 56. Suitable nonionic surfactants include ethoxylated nonyl phenols such as the POLY-TERGENT B-series from Olin Corporation or alkoxylated linear alcohol's such as the POLY-TERGENT SL-series, also from Olin Corporation.

If the total dispersion is acidic, it is preferred to employ selected anionic surfactants or cationic surfactants. An acceptable group of anionic surfactants would be the sodium or potassium salts of naphthalene sulfuric acid described above. Acceptable cationic surfactants include acetyl dimethyl benzyl ammonium chloride such as AMMONYX T, commercially available from Onyx Chemical Corporation; an ethanolated alkylguanidine amine complex such as AEROSOL C-61, commercially available from American Cyanamid; lipocals; dodecyldiphenyl oxide disulfonic acid (DDODA) such as DOWFAX 2A1, commercially available from Dow chemical; a sodium salt of DDODA such as STRODEX, commercially available from Dexter Chemical Corporation; and salts of complex organic phosphate esters. More preferred surfactants include amphoteric potassium salts of a complex amino acid based on fatty amines such as MAFO 13 and cationic ethoxylated soya amines such as MAZEEN D-5 or MAZTREAT, commercially available from Mazer Chemical Co. Combinations of surfactants may be employed.

Advantageously, carbon is present in the dispersion in an amount of less than about 15% by weight of the dispersion, preferably less than about 5% by weight, most preferably less than 2% by weight when the form of carbon is carbon black it has been found that the use of higher concentrations of carbon blacks may provide undesirable plating characteristics. In the same regard, the solids content (i.e. all of the ingredients other than the liquid dispersing medium) is preferably less than about 10% by weight of the dispersion, more preferably, less than about 6% by weight.

The liquid dispersion of carbon is typically placed in a vessel and the printed circuit board is immersed in, sprayed with or otherwise contacted with the liquid dispersion. The temperature of the liquid dispersion in an immersion bath should be maintained at between about 15° C. and about 35° C. and preferably between about 20° C. and about 30° C. during immersion. The period of immersion advantageously ranges from about 15 seconds to about 10 minutes, more preferably from about 30 seconds to 5 minutes.

The immersed board is then removed from the bath of the liquid carbon-containing dispersion and is preferably contacted with compressed air to unplug any through holes that may still retain plugs of the dispersion. In addition, excess basic liquid carbon-containing dispersion is removed from the face of the copper plates.

Next, substantially all (i.e. over about 90% by weight) of the water (or other liquid dispersing medium) in the applied dispersion is removed and a dried deposit containing carbon is left on the surfaces of the non-conducting material. This may be accomplished by several methods such as by evaporation at room temperature, by a vacuum, or by heating the board for a short time at an elevated temperature. Heating at an elevated temperature is the preferred method. Heating is generally carried out for between about 5 and about 45 minutes at a temperature of from about 75° C. to about 120° C., more preferably from about 80° to 98° C. To insure complete coverage of the hole walls, the procedure of immersing the board in the liquid carbon dispersion and then drying may be repeated one or more times.

The resulting PCB is often completely coated with the carbon dispersion. The dispersion is not only coated on the drilled hole surfaces, as desired, but also coats the copper plate or foil surfaces, which is disadvantageous. Thus prior to any further processing, the carbon should be removed from the copper plate or foil surface.

The removal of the carbon may be preferably achieved by the employment of a mechanical scrubbing operation or a microetch. The microetch is preferred because of ease of use. In the case of a multilayer type board, this microetching step is especially preferred, since, after the drying step, not only will the outer copper plate or foil be coated with carbon but also the copper inner plates or foils exposed within the holes.

If carbon black is chosen the dispersion used to coat the non-conducting surface with carbon can also contain other constituents. One constituent which may advantageously be included is graphite. In fact, the dispersion may be prepared by milling a dispersion of graphite until carbon black is obtained. Furthermore, a coating of carbon black according to the invention can have applied thereto a graphite dispersion, such as taught by Randolph and Nelson in U.S. Pat. No. 5,139,642, the disclosure of which is incorporated herein by reference, to improve the electroplating operation.

The thusly treated printed wiring board is then immersed in a suitable electroplating bath for applying a copper coating on the hole walls of the non-conducting layer.

The present invention contemplates the use of any and all electroplating operations conventionally employed in applying a metal layer to the through hole walls of a PCB. Therefore this claimed invention is not limited to any particular electroplating bath parameters.

A typical copper electroplating bath is comprised of copper, copper sulfate, $H_2SO_4$ and chloride ion in aqueous solution. The electroplating bath is normally agitated and preferably maintained at a temperature of between about 20° C. and about 25° C. The electroplating bath is provided with anodes, generally constructed of copper, and the primed circuit board to be plated is connected as a cathode to the electroplating circuit. A current is then impressed across the electroplating circuit for a period of between about 60 and about 90 minutes in order to effect copper plating on the hole walls of the non-conducting layer positioned between the two plates of copper. This copper plating of the hole wall provides a current path between the copper layers of the printed circuit board. Other suitable electroplating conditions may be employed, if desired. Other electroplating bath compositions containing other copper salts or other metal salts such as salts of nickel, gold, silver and the like may be employed, if desired.

The primed circuit board is removed from the copper electroplating bath and then washed and dried to provide a board which is further processed by applying photoresist compounds and the like, as is known in the art for the preparation of primed circuit boards.

The invention is further illustrated with reference to the following examples which should not be taken as limiting.

EXAMPLE 1

100 grams of Raven 3500 from Columbian Chemical Corporation was mixed by hand with 1200 mL deionized water and 1 gram Methylene Blue dye was added. After mixing for several minutes the mixture was allowed to settle; the supernatant liquid was colorless. The mixture was filtered and the wetcake determined to be approximately 35% carbon. 90 grams of this wetcake were mixed with 30 grams of dispersing agent by hand. 70 grams of potassium carbonate were added and the mixture was again mixed by hand. 100 grams of deionized water was added and the mixture was mixed on a high shear mixer. A further 210 grams deionized water was added and the mixture again mixed with a high shear mixer.

A working bath was made from this concentrate by diluting 250 grams of the concentrate to 2000 grams, giving a concentration of 3.0% by weight solids. Average particle size of the suspended carbon, as determined by Nicomp Particle Size, Model 370, was approximately 160 nanometers (nm).

A 4 inch by 6 inch copper clad panel with a standard hole pattern was processed through a cleaner/conditioner, rinsed, treated with the above working carbon dispersion; excess carbon suspension was removed by air knife and the panel dried. After equilibrating for several minutes the panel was microetched, rinsed, treated with an acidic antitarnish, rinsed and dried in a standard Blackhole microetch machine. After again equilibrating for several minutes the side to side resistance of the through hole panel was approximately 800 ohms. A second panel was treated through the same cycle except that a standard Blackhole Process II working bath (ie. unmodified carbon black dispersion available from MacDermid, Incorporated, 245 Freight Street, Waterbury, Conn. 06702) was substituted for the Methylene Blue modified carbon working bath above. After microetching as above and equilibrating the resistance of the panel through the holes was approximately 2.8 kilohms.

Both panels were cleaned in Metex acid cleaner 9268 (MacDermid), 125° F., 3 minutes; cold water rinse, 2 minutes; G-4 (MacDermid) microetch, 85° F., 15 seconds; cold water rinse, 1 minute; 10% sulfuric acid, 2 minutes; and plated in 9241 acid copper (MacDermid) at 25 ASF for fifteen minutes. Coverage on the panel treated with the carbon modified with Methylene Blue was significantly better than coverage on the panel treated with the standard Blackhole working formulation.

EXAMPLE 2

100 grams of Raven 3500 was treated as in Example 1, except that the Methylene Blue dye was replaced by 1 gram of Methyl Red indicator. The mixture was stirred until the supernatant liquid was light pink, settled and filtered. A concentrate was made from the wetcake by the method of Example 1 and a working bath was made from this concentrate. The working bath was 3.1% by weight solids and had an average particle size of approximately 170 nm.

One panel was treated through this working bath as in Example 1; a second panel was treated through a standard Blackhole Process II (MacDermid) working bath as in Example 1. After microetching the panel treated with the Methyl Red modified working bath had a through-hole resistance of approximately 1.2 kilohms, while the control panel had a through-hole resistance of approximately 2.2 kilohms. After plating through the cycle of Example 1 the panel treated with the Methyl Red modified carbon had significantly better coverage than the panel run through the standard Blackhole bath.

EXAMPLE 3

100 grams of Raven 3500 was treated as in Example 1, except that Janus Green B dye was substituted for the Methylene Blue. The resulting wetcake was approximately 27% carbon. 110 grams of this wetcake were made into a carbon dispersion concentrate by the method of Example 1, except that 85 mL of 45% potassium hydroxide solution was substituted for the potassium carbonate. A working bath was made from this mixture by diluting 250 grams to 2000 grams and adjusting the pH to 10.8 with carbon dioxide. The final concentration was 3.1% by weight solids with an average particle size of approximately 160 nm.

Panels were treated as in Example 1, except that the Janus Green B modified carbon working bath was substituted for the Methylene Blue working bath. After microetching, the through-hole resistance of the panel treated with the Janus Green B modified carbon was approximately 200 ohms, while the panel treated through the standard Blackhole bath had a through-hole resistance of approximately 750 ohms. After plating as in Example 1, the panel treated with the Janus Green B modified carbon had significantly better coverage than the panel treated with the standard Blackhole working bath.

EXAMPLE 4

Panels were treated as in Example 3. After microetching, the resistance of the panel treated with the Janus Green B modified carbon was approximately 350 ohms, while the resistance of the panel treated with the standard Blackhole working bath was approximately 650 ohms. After plating for one hour the panel treated with the Janus Green B modified carbon had significantly better coverage than the panel treated with the standard Blackhole working bath.

EXAMPLE 5

A concentrated carbon dispersion ("control") was made up as follows: 75 grams of Raven 3500 were mixed by hand with 250 grams of deionized water and 40 mL of 45% potassium hydroxide solution were added. The mixture was hand mixed and 25 grams of dispersing agent were added with hand mixing. The total weight was brought to 600 grams with deionized water and the concentrate was mixed with a high shear mixer. A working bath was made from this by diluting 125 grams to 2000 grams with deionized water. The pH was lowered from 12.6 to 10.5 with carbon dioxide. The concentration of this bath was 1.0% solids and the average particle size was approximately 140 nm.

80 grams of Raven 3500 were mixed with 1000 grams deionized water while stirring with a magnetic stir bar. 0.16 grams of palladium ion as palladium chloride solution was added with stirring. After several minutes approximately 0.5 grams dimethylamineborane was added to the mixture to reduce the palladium onto the surface of the carbon. 0.16 grams Xylene Cyanole indicator dissolved in 300 mL water was then added with mixing and the mixture was settled and filtered. To this wetcake was added with hand mixing 100 grams deionized water and the mixture was mixed on a high shear mixer at high speed. 85 mL of 45% potassium hydroxide solution was added during the mixing. The total weight was brought to 600 grams and the concentrate was mixed on the high shear mixer for 30 minutes.

A working bath was made from this concentrate by diluting 90 grams to 2000 grams. The pH was lowered from 12.7 to 10.6 with carbon dioxide. The concentration of this working bath was 1.2% solids; average particle size was approximately 170 nm, Panels were treated as in Example 1, except that the palladium/Xylene Cyanole modified carbon working bath was substituted for the Methylene Blue working bath and the "control" working bath was substituted for the standard Blackhole working bath. After microetching, the through-hole resistance of the panel treated with the palladium/Xylene Cyanole modified carbon was approximately 400 ohms while the through-hole resistance of the panel treated with the "control" bath was approximately 200 ohm. The panels were plated as in Example 1, except that a plating time of only three minutes was used. Coverage on the panel treated with the palladium/Xylene Cyanole modified carbon was much better than coverage on the panel treated with the "control" bath.

EXAMPLE 6

80 grams of Raven 3500 were mixed with 1000 mL, deionized water and 10 grams potassium carbonate with high speed mixing and 0.16 grams palladium ion dissolved in 200 mL deionized water was added slowly. 0.5 grams dimethylamineborane was added to reduce the palladium onto the carbon surface. 8 grams cobalt chloride hexahydrate and 30 grams malic acid in 200 mL deionized water at pH 10.5 were added. 35 grams sodium hypophyosphite were added and the mixture was heated to 200° F. 5 mL of 50% sodium hydroxide were added slowly and 1 gram dimethylaminoborane in 20 mL solution was added slowly. Heavy gassing began. After the gassing stopped the mixture was cooled, settled and filtered. The filtrate was colorless.

This wetcake was made into a concentrate by the procedure described for the palladium/Xylene Cyanole modified carbon in Example 5. A working bath was made by diluting 723 grams to 2100 grams with deionized water. The pH was lowered from 12.8 to 10.6 with carbon dioxide. Concentration of this working bath was 0.9% solids; average particle size was approximately 165 nm.

Panels were treated with this working bath and with the "control" bath of Example 5. Through-holes resistance after microetching of the panel treated with the palladium/cobalt modified carbon was approximately 300 ohms, while through-hole resistance of the panel treated in the "control" was approximately 250 ohms. After plating for 3 minutes, coverage on the panel treated with the palladium/cobalt modified carbon was much greater than coverage on the panel treated with the "control".

EXAMPLE 7

70 grams of the control concentrate from Example 5 were diluted to 2100 grams with deionized water. The pH was lowered from 12.5 to 10.6 with carbon dioxide. Concentration of this working bath was 0.7% solids; average particle size was approximately 140 nm.

80 grams of Raven 3500 were mixed with 1500 mL dionized water and 10 grams potassium carbonate at high speed. 0.16 grams palladium ion dissolved in 200 mL deionized water were added slowly with high speed mixing. 0.5 grams dimethylaminoborane in 10 mL solution were added slowly. The mixture was settled and filtered. The wetcake was made into a concentrate by the method described for the palladium/Xylene Cyanole modified carbon of Example 5. A working bath was made from this concentrate by diluting 65 grams to 2100 grams with deionized water. The pH was lowered from 12.8 to 10.7 with carbon dioxide. The concentration of this bath was 0.7% solids and the average particle size was approximately 170 nm.

Panels were treated with these working baths for plating as in previous Examples. After microetching, the through-hole resistance of the panel treated with the palladium modified carbon was approximately 700 ohms and the through-hole resistance of the panel treated with the "control" carbon was approximately 800 ohms. The panels were plated for 70 minutes at 25ASF. After 3 minutes plating, coverage was nearly complete on the panel treated with the palladium modified carbon, while the panel treated with the "control" carbon showed significantly more voiding. After 70 minutes of plating, the panel treated with the palladium modified carbon was completely covered, while the panel treated with the standard carbon showed voiding.

EXAMPLE 8

20 grams Ensaco 23 MM carbon powder were mixed with 100 mL concentrated nitric acid to give a grainy mass. 200 mL deionized water was added and the mass mixed thoroughly by hand. This mixture was heated to approximately 100° C. with stirring and cooled. Volume was brought to approximately 1200 mL and the sample was allowed to settle overnight. The sample was filtered and to the wetcake was added 30 mL of 45% potassium hydroxide solution and 20 grams dispersant. The mixture was mixed at high speed on a high shear mixer for 8 hours.

100 grams of this concentrate were diluted to 2100 grams with deionized water. The pH was 7.4; raised to 11.0 with 45% potassium hydroxide solution. The concentration of the dispersion was 1.3% by weight solids. A bimodal particle distribution was observed with 52% average particle size of 124 nm and 48% average particle size 470 nm. The diluted suspension is brown with fine undispersed particulation observed.

A concentrate was made by mixing 20 grams Ensaco 23 MM carbon with 100 mL deionized water, 21 mL 45% hydroxide and 20 grams dispersant. When mixed the mixture became very thick and 200 mL deionized water was added. The sample was mixed at high speed for 2 hours. 220 grams of this concentrate were diluted to 2100 grams with deionized water and the pH was adjusted to 11.0 with carbon dioxide. The concentration was 1.1% solids and the particle size was approximately 220 nm. Appearance is light brown with gross undispersed particulation observed.

Panels were treated with the above described dispersions as indicated in Example 1. After microetching, the resistance of the panel treated with the Ensaco 23 MM dispersion was approximately 250 ohms, while resistance of the panel treated with the oxidized Ensaco 23 MM dispersion was approximately 700 ohms. After plating in acid copper for 5 minutes the panel treated with the oxidized Ensaco 23 MM carbon dispersion had copper coverage in the through-holes of approximately 60%, while copper coverage in the through holes for the panel treated with the unoxidized Ensaco 23 MM carbon dispersion was only approximately 20%.

What is claimed is:

1. A process for electroplating a conductive metal layer onto the surface of a non-conductive material comprising the following steps:
   (a) contacting said non-conductive surface with a liquid carbon dispersion comprising:
      (1) carbon particles which have been contacted with an aqueous metal containing bath such that metallic species are either adsorbed or reduced onto the surface of said carbon particles, said carbon particles having an average particle diameter of less than 3.0 microns in said dispersion;
      (2) a dispersant;
      (3) a liquid dispersing medium;
   (b) separating substantially all of the dispersing medium from said carbon particles, where said particles are deposited on said non-conductive surface in a substantially continuous layer; and
   (c) electroplating a conductive metal layer over the deposited carbon layer and said non-conductive surface; and wherein said metal containing bath comprises a metal selected from the group consisting of colloidal metallic species, metal ions, and combinations thereof.

2. A process according to claim 1 wherein the metallic species are selected from the group consisting of palladium, gold, silver, platinum, nickel, copper, cobalt and mixtures thereof.

3. A process according to claim 2 wherein the bath is a plating activator.

4. A process according to claim 2 wherein the bath is selected from the group consisting of metal ions in solution and colloidal metallic species in aqueous dispersion.

5. A process according to claim 3 wherein the bath is selected from the group consisting of ionic palladium containing activators, colloidal palladium activators, colloidal palladium-tin activators, ionic gold containing activators, ionic copper containing activators, ionic rhodium containing activators and ionic ruthenium containing activators.

6. A process according to any one of claims 1 through 5 wherein the plating requires less time to achieve substantially complete coverage of the non-conductive surface as compared to plating with carbon which has not been contacted with the metal containing bath.

7. A process according to any one of claims 1 through 5 wherein the process plates larger areas of non-conductive surface under otherwise similar conditions as compared to a process utilizing carbon which has not been contacted with the metal containing bath.

8. A process according to any one of claims 1 through 5 wherein the carbon particles are selected from the group consisting of carbon black, graphite, intermediate carbon structures and mixtures thereof.

9. A process for electroplating a conductive metal layer onto the surface of a non-conductive material comprising the following steps:
   (a) contacting said non-conductive surface with a liquid carbon dispersion comprising:
       (1) carbon particles which have been contacted with a specie selected from the group consisting of dyes, indicators and mixtures thereof, said carbon particles having an average particle diameter of less than 3.0 microns in said dispersion;
       (2) a dispersant;
       (3) a liquid dispersing medium;
   (b) separating substantially all of the dispersing medium from said carbon particles, where said particles are deposited on said non-conductive surface in a substantially continuous layer; and
   (c) electroplating a conductive metal layer over the deposited carbon layer and said non-conductive surface.

10. A process according to claim 9 wherein the specie is selected from the group consisting of methylene blue, methyl red, janus green B, xylene cyanole and mixtures thereof.

11. A process according to claim 9 wherein the specie contains an aromatic structure and at least one nitrogen.

12. A process according to any one of claims 9 through 11 wherein the plating requires less time to achieve substantially complete coverage of the non-conductive surface as compared to plating with carbon which has not been contacted with the specie indicated in claim 9.

13. A process according to any one of claims 9 through 12 wherein the process plates larger areas of non-conductive surface under otherwise similar conditions as compared to a process utilizing carbon which has not been contacted with the specie indicated in claim 9.

14. A process according to any one of claims 9 through 11 wherein the carbon particles are selected from the group consisting of carbon black, graphite intermediate carbon structures and mixtures thereof.

15. A process for electroplating a conductive metal layer onto the surface of a non-conductive material comprising the following steps:
   (a) contacting said non-conductive surface with a liquid carbon dispersion comprising:
       (1) carbon particles which have been contacted with an oxidant, said carbon particles having an average particle diameter of less than 3.0 microns in said dispersion;
       (2) a dispersant;
       (3) an aqueous liquid dispersing medium;
   (b) separating substantially all of the dispersing medium from said carbon particles, where said particles are deposited on said non-conductive surface in a substantially continuous layer; and
   (c) electroplating a conductive metal layer over the deposited carbon layer and said non-conductive surface.

16. A process according to claim 15 wherein the oxidant is selected from the group consisting of nitric acid, hydrogen peroxide, persulfates and permanganates.

17. A process according to any one of claims 15 through 16 wherein the plating requires less time to achieve substantially complete coverage of the non-conductive surface as compared to plating with carbon which has not been contacted with an oxidant.

18. A process according to any one of claims 15 through 16 wherein the process plates larger areas of non-conductive surface under otherwise similar conditions as compared to a process utilizing carbon which has not been contacted with an oxidant.

* * * * *